United States Patent [19]
Jeffryes et al.

[11] Patent Number: 5,575,850
[45] Date of Patent: Nov. 19, 1996

[54] PROCESSING SYSTEM

[75] Inventors: Andrew I. Jeffryes; Gordon R. Green, both of Avon, United Kingdom

[73] Assignee: Electrotech Limited, Avon, United Kingdom

[21] Appl. No.: 591,026

[22] Filed: Jan. 25, 1996

Related U.S. Application Data

[62] Division of Ser. No. 426,018, Apr. 20, 1995, Pat. No. 5,518,771, which is a continuation of Ser. No. 964,044, Oct. 21, 1992, abandoned.

[30] Foreign Application Priority Data

Oct. 25, 1991 [GB] United Kingdom ............ 9122676

[51] Int. Cl.⁶ ........................................... B05D 3/04
[52] U.S. Cl. ........................................... 118/50
[58] Field of Search ................................... 118/50

[56] References Cited

U.S. PATENT DOCUMENTS 3,599,601  8/1971  Ishikawa ............ 118/50
4,007,706  2/1977  Arvidsson ........... 118/50
5,194,406  3/1993  Bok ................... 118/50

FOREIGN PATENT DOCUMENTS 0381253  8/1990  European Pat. Off. .
0425796  5/1991  European Pat. Off. .

*Primary Examiner*—Richard Bueker
*Attorney, Agent, or Firm*—Wenderoth, Lind & Ponack

[57] ABSTRACT

In order to subject a workpiece, such as a semiconductor wafer, to elevated pressures the workpiece is enclosed in a void (16) between two enclosure parts (6,7) which have been forced together by upper and lower actuators (12,13). The enclosure parts (6,7) are themselves enclosed in a vacuum chamber (1) evacuatable by a vacuum pumping system. Gas is then supplied from a suitable pressure source via a pipe (17) into void (10), thereby to subject the workpiece to elevated pressure. Heating means may be provided to permit the workpiece to be subject to elevated temperature.

4 Claims, 3 Drawing Sheets

PROCESSING SYSTEM

This is a Divisional of application Ser. No. 08/426,018, filed Apr. 20, 1995, now U.S. Pat. No. 5,518,771 which in turn is a Continuation of abandoned application Ser. No. 07/964,044, filed Oct. 21, 1992, now abandoned.

BACKGROUND OF THE INVENTION

1. Field of the Invention

The present invention relates to a processing system for processing workpieces. It is particularly, but not exclusively concerned with processing systems in which the workpiece is a semiconductor wafer.

2. Summary of the Prior Art

In the processing of semiconductor wafers and other similar workpieces, it is sometimes necessary to form layers which fill small holes (vias) in underlying layers on the wafer. It has been appreciated that it is possible to fill those holes by subjecting the wafer to elevated pressures, and possibly elevated temperatures, to cause the upper layer to deform to fill the hole.

SUMMARY OF THE INVENTION

In our UK patent application number 9111440.5 we discussed a method of filling holes in this way, using elevated pressures and temperatures. The present invention is particularly applicable to the arrangement for filling holes disclosed in UK patent application number 9111440.5, but may be applicable to other arrangements.

Thus, the present invention seeks to provide an arrangement in which a workpiece, such as a semiconductor wafer, can be subjected to elevated pressures under controlled conditions.

At its most general, the present invention proposes that a pair of enclosure parts are forceable together, and their opposed surfaces are shaped so as to define an enclosed void when the two enclosure parts are forced together. This enclosed void may then contain the workpiece to be processed.

Hence, it is normally necessary to provide one or more ducts in at least one of the enclosure parts, that duct extending to the surface of the corresponding enclosure part defining a wall of the void, so as to permit pressurised gas to be fed to the void, to increase the pressure therein. Since the interior of that void will be subject to elevated pressure, it is then necessary to ensure that the force which holds together the enclosure parts is sufficient to resist that pressure.

Preferably, there are two enclosure parts forceable together by hydraulic, pneumatic or similar means, so that the void is formed at the interface between those two parts. However, more complex arrangements, using more enclosure parts, are also possible.

It should be noted that it is known to provide high pressure chambers for processing castings, in which the casting is subject to elevated pressures, and also for compacting powders (sintering). However, it has not previously been proposed (except in our UK patent application number 9111440.5) to subject a semiconductor wafer to elevated pressures so as to cause deformation of a layer to fill holes in a lower layer.

Suitable heating means may be provided within, or adjacent, the enclosed void to cause heating of the workpiece. For example, if processing semiconductor wafers, temperatures of the order of 400° C. or more, and pressures of 3000 p.s.i or greater have been found suitable.

In the processing of semiconductor wafers making use of the present invention, aluminium and its alloys are likely to form one or more of the layers. In this case, such a layer or layers is normally formed by sputtering or evaporation. The subsequent exposure to high pressure to fill the holes is most effective if the layer(s) is not exposed to air, as such exposure would oxidise the surface of the layer and may slowly penetrate into the holes before they are filled. Thus oxidation may make it harder for the material to deform into the holes when the high pressure is applied. This is because the oxidised surface is less ductile.

Therefore, it is preferable that a duct (or possibly several ducts) is provided extending to the enclosed void, which duct is connected or connectable to suitable gas evacuation means, for achieving a suitable low pressure (hereinafter vacuum) within the enclosed void. Alternatively, or in addition, the gas supplied to the enclosed void may be an inert gas, so that the problem of oxidation can be avoided.

In the formation of the layer which is deformed to fill the hole, the layer should normally wholly cover the hole before it is exposed to high pressure. The reason for this is that a gas at low pressure or preferably vacuum is trapped within the (sealed) hole, and this makes it relatively easy to deform the covering layer when pressure is exerted. This is another reason for preferring an arrangement which permits a vacuum to be formed within the enclosed void, since the vacuum then provides less resistance to compression than would gas at atmospheric pressure.

As was mentioned above, it is important that the means for forcing together the enclosure parts exerts sufficient force to resist the high pressure that will be created within the enclosed void.

For safety reasons, a valved outlet may be provided from the void, which valve is controlled by the difference between the pressure in the enclosed void and the force which holds together the enclosure parts. For example, if at least one of the enclosure parts is moved by pneumatic pressure, a simple one-way spring-return valve between the enclosed void and the chamber subject to that pneumatic pressure will ensure that the pressure within the enclosed void does not exceed that exerted by the pneumatic pressure by more than the spring force in the one-way valve.

The present invention relates to both method and apparatus aspects of the present invention.

In a preferred form of an apparatus according to the present invention, there are two enclosure parts supported within a yoke structure. Means are provided for subjecting the enclosed void to vacuum.

When the workpiece has been transferred into the apparatus under vacuum, the two enclosure parts of the apparatus are moved together to form a pressure containment vessel around the workpiece. This vessel is shaped to contain a thin flat workpiece in a chamber (the enclosed void) of approximately cylindrical shape, where the height of the cylinder is much less than its diameter. An inert gas, typically argon, is then pumped into the chamber by a hydraulic pump to a high pressure (typically in the range 200–2000 bar). The high pressure gas is also used to force the enclosure parts of the chamber together, so that they remain sealed together. The chamber also contains one or more heating elements and temperature measuring devices, so that the temperature of the gas surrounding the workpiece can be controlled.

The precise temperature and pressure required depends on the layer material, and are controlled at the level required to force the material into the holes, and maintained for the time necessary for the material to fill the holes completely.

After sufficient time at high pressure, the gas is released from the pressure chamber, which returns to near atmospheric pressure. It may then be pumped to vacuum using a vacuum pump, and the two enclosure parts of the pressure chamber are moved apart to allow the workpiece to be removed. Alternatively, the chamber parts can be moved apart at atmospheric pressure and the workpiece removed. The workpiece may be transferred by the processing equipment to which the apparatus is attached for unloading or for further processing. Where another layer is to be deposited, vacuum transfer is preferred to avoid contamination of the layer surface.

The apparatus must be capable of containing the forces by the very high internal pressure generated. The present invention is preferably designed for processing thin flat workpieces, and the apparatus is preferably such that most of the force produced by the internal pressure is perpendicular to the plane of the workpiece.

The volume of the enclosed void in the present invention is preferably minimised so that the time taken to cycle the chamber between the vacuum and high pressure is minimised. Typical cycle times from vacuum to high pressure and back to vacuum range from a few minutes to less than one minute.

Where the workpiece is a semiconductor wafer, it is important that as few particles or other contaminants as possible are deposited on the workpiece. The apparatus of the present invention should preferably be designed to have clean internal surfaces, with minimum moving parts near or above the wafer that might generate particles. The gas used to pressurise the apparatus may be filtered to remove as many particles as possible. The gas is desirably an inert gas of high purity, so as not to cause contamination of the wafer or to react with the layers deposited on the wafer.

BRIEF DESCRIPTION OF THE DRAWINGS

Embodiments of the present invention will now be described in detail, by way of example, with reference to the accompanying drawing in which.

DETAILED DESCRIPTION

Figure 1:
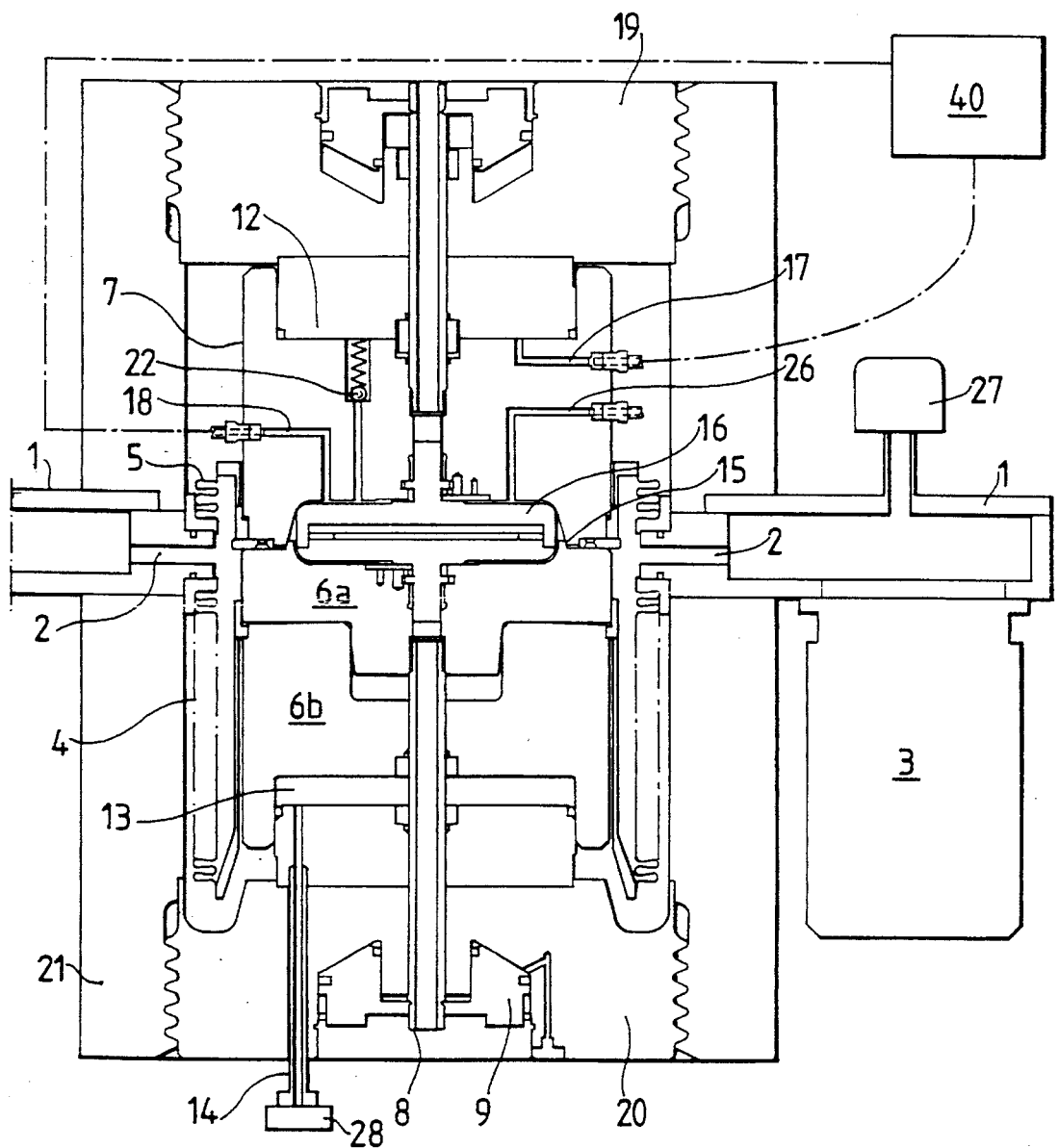
FIG. 1 shows a apparatus for processing workpieces according to a first embodiment of the present invention.

Referring to FIG. 1, a generally annular vacuum chamber 1 is attached to an apparatus (not shown) which contains a system for transferring thin flat workpieces under vacuum via passageways 2, and which also contains means for depositing a layer on the workpiece. A vacuum pumping system 3 (shown schematically) is attached to the vacuum chamber 1. The vacuum chamber 1 surrounds and is attached via a lower bellows 4 and an upper bellows 5 to a lower enclosure part 6 and an upper enclosure part 7 respectively, to define a pressure vessel.

The lower enclosure part 6 is itself divided into two parts 6a, 6b as will be described in more detail later.

The bellows 4,5 allow the two enclosure parts 6,7 of the pressure vessel to move vertically with respect to the vacuum chamber 1. The lower enclosure part 6 of the pressure vessel is attached via a connecting tube 8 to a pneumatically actuated cylinder 9, which is used to lower the lower enclosure part 6 so that a workpiece (10 in FIG. 2) can be loaded onto the lower enclosure part 6 of the vessel. The workpiece rests on supports (11 in FIG. 2) attached to the lower enclosure part 6.

The upper and lower enclosure parts 7,6 of the pressure vessel are shaped at the top and bottom respectively so that an upper cylinder actuator 12 and a lower cylinder actuator 13 fit into them. After loading of the workpiece, fluid is supplied to the lower actuator 13 through a pipe 14 from a hydraulic pressure system attached to the apparatus. The pressure is sufficient to force the upper and lower enclosure parts 7 and 6 together and form a seal along a line 15 around an approximately cylindrical enclosed void 16. It can be noted that the surfaces of the upper and lower enclosure parts 6,7 which meet at line 15 are in the shape of matching frusto-cones, i.e. in this embodiment the line 15 is inclined to the axis of movement of the upper and lower enclosure parts. As will be discussed later, the line 15 may be generally perpendicular to the axis of movement.

Gas is then supplied from a further pressure source 40 (shown schematically) to the upper actuator 12 via a pipe 17 and into the enclosed void 16 via another pipe 18. The gas pressure also operates a blocking valve 28 in the fluid pipe 14 supplying the lower actuator 13. This lower actuator 13 is thus locked in position as the fluid is almost incompressible. Because the horizontal area of the upper actuator is greater than the horizontal area of the enclosed void 16, there is a net closing force to maintain the seal at surface 15 between the two parts.

The upper actuator 12 is supported by an upper endpiece 19, and the lower actuator 13 by a lower endpiece 20. The endpieces are screwed into a yoke 21. The forces from the high pressure in the actuators 12 and 13 are mostly vertical, and are supported by the yoke 21 via the endpieces 19 and 20. When the system is pressurised to 1000 bar, the force supported by the yoke is approximately 50 MN when the enclosed void is large enough to receive a workpiece of diameter 200mm.

A safety valve 22 is fitted to ensure that the upward force from the enclosed void 16 does not exceed the downward force in the actuator 12 so that the seal at surface 15 does not burst open if a fluid leak from actuator 13 occurs.

This is because the spring force in the safety valve 22 is chosen so that the pressure difference between the enclosed void 16 and the actuator 12 is limited to a value less than $$\frac{(d_1^2 - d_2^2)}{d_1^2} \times P$$

where $d_1$ is the diameter of the actuator 12, $d_2$ is the diameter of the enclosed void 16, and P is the pressure in the enclosed void 16.

Thus, if a fluid leak from actuator 13 does occur, parts 6 and 7 will descend together under the greater force from actuator 12, and the seal at surface 15 is maintained.

Heaters, an upper thermocouple and a lower thermocouple (shown schematically at 41,42) may be fitted to the upper and lower enclosure parts 7,6 of the pressure vessel 1 to provide controlled heating of the pressurised gas in the enclosed void 16, and thus control the temperature of the workpiece by the convection of the gas inside the enclosed void 16.

After the workpiece has been maintained at sufficient temperature and pressure for a sufficient time for the layer material to have been forced into the holes therein, the pressurised gas in the enclosed void 16 and the actuator 12 is released through the pipes 18 and 17. The enclosed void 16 is pumped to rough vacuum through the pipe 26. This pipe is attached to the vacuum pumping system 3 via a self-locking valve (not shown) to prevent escape of gas when under pressure. A blocking valve 28 is then opened to allow the hydraulic fluid in actuator 13 to leave, and the pneumatic actuator 9 is then used to lower the lower enclosure part 6 of the pressure vessel releasing the seal at line 15.

The enclosed void 16 is opened to the vacuum chamber 1 and further pumped to vacuum by the vacuum pumping system 3. The pressure in the vacuum-chamber 1 may be monitored by a vacuum pressure sensor 27. When the vacuum pressure is sufficiently low the workpiece 10 is removed by the transfer mechanism from the apparatus 2.

Figure 2:
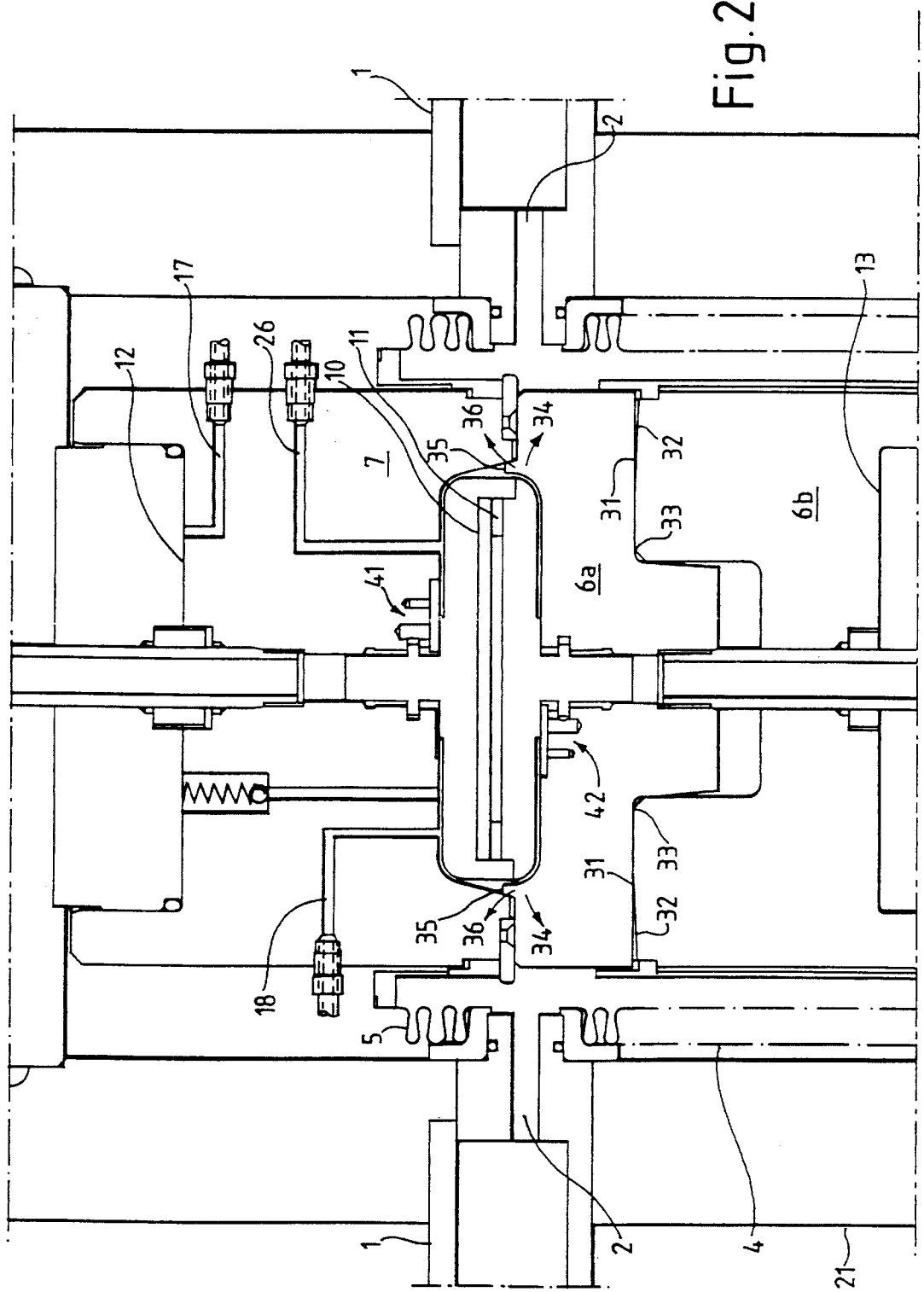
FIG. 2 shows a detail of the apparatus of FIG. 1.

The sealing at surface 15 around the enclosed void 16 will now be described in more detail, with reference to FIG. 2. It can be seen from FIG. 2 that the two parts 6a, 6b of the lower enclosure part 6 are shaped so that their adjacent surfaces 31, 32 are inclined relative to each other. This inclination is exaggerated for the sake of clarity in FIG. 2, but results in those two surfaces 31, 32 meeting at a line 33. When the enclosed void 16 is subjected to high pressure, the part 6a of the upper enclosure part 6 deforms slightly in the direction of arrows 34, relative to the part 6b, with the surface 31 pivoting about line 33, which thus acts as fulcrum. Hence, the upper parts of part 6a move slightly outwardly and downwardly, as the surface 31 pivots about line 33.

This deformation causes a lip 35 on the upper surface of part 6a to be forced outwardly in the direction of arrows 36 and hence to press firmly into the upper enclosure part 7 at the sealing surface 15. Hence, the strength of the seal is increased in proportion to the increased pressure in the enclosed void 16. In order for the correct deformation to occur, the part 6a is thinner than both parts 6b and 7 so that it deforms more under pressure.

Hence, this structure of the apparatus ensures good sealing of the enclosed void 16.

Figure 3:
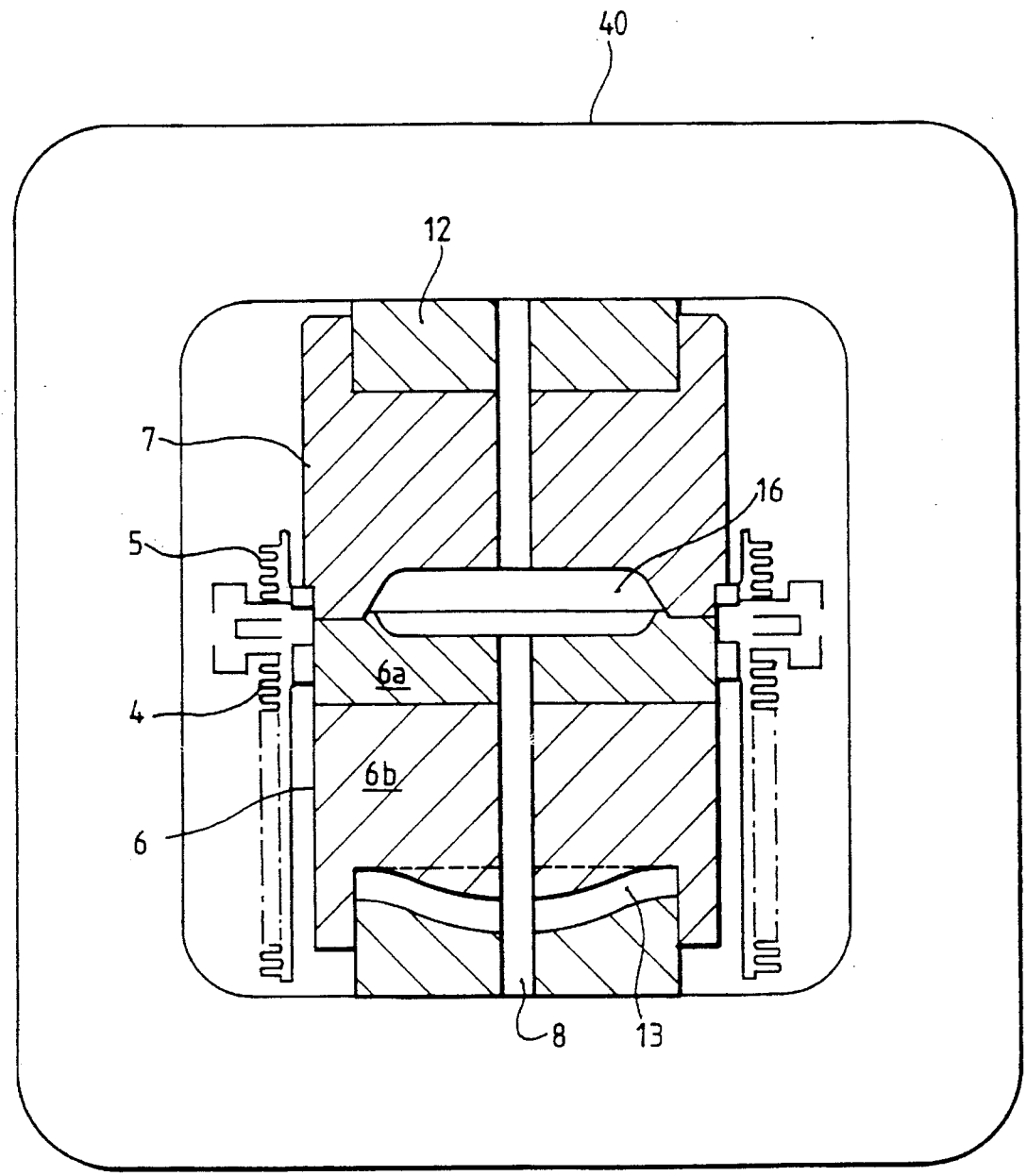
FIG. 3 shows an apparatus for processing workpieces according to a second embodiment of the present invention.

FIG. 3 shows a second embodiment of the present invention. The only difference between that embodiment and the embodiment of FIGS. 1 and 2 concerns the structure of the yoke, and the other parts of this apparatus may be substantially the same as those of the first embodiment. Corresponding parts are indicated by the same reference numerals, and some structural features, such as pipes have been omitted for the sake of clarity.

In the embodiment of FIG. 3, the yoke 40 is in the form of a ring surrounding the rest of the apparatus, and thus does not have separate side and end pieces. This type of yoke is easier to make, and may be lighter than the yoke of the first embodiment, but has the disadvantage that the yoke 40 must then be slid out sideways from the rest of the apparatus for access and maintenance. Furthermore, the total size of the apparatus is large.

Many modifications to the above embodiments are possible within the scope of the present invention. For example, it is possible for the upper and lower enclosure part to meet at surfaces perpendicular to their direction of movement, rather than inclined surfaces formed by frusto-cones. Such perpendicular surfaces do not provide as good a seal as the use of frusto-cones, but the seal may be sufficient for many purposes, and the avoidance of frusto-conical surfaces is more tolerant of mis-alignment and height mis-adjustments, and therefore may offer practical advantage.

As described previously, hydraulic fluid is supplied e.g to the lower actuator 13 from a hydraulic pressure system. In a development of the present invention, that hydraulic system may also be used to provide initial compression of the gas to be supplied to the void 16, although to achieve the high pressures desired, it is normally necessary to use a further hydraulic system with e.g. differential area pistons, to increase the gas pressure further.

Furthermore, in order to minimise gas wastage, the gas extracted by the vacuum system 3, and from the void via pipe 26 may be re-cycled to the further pressure source 40.

It may be noted that, in FIG. 1, the upper and lower end pieces 19,20 are screwed into the yoke 21. Alternatively, a bayonet fitting may be used.

What we claim is:

1. A processing system for a workpiece comprising:

a pressure vessel, said pressure vessel having a plurality of enclosure parts;

first means for forcing said enclosure parts into abutment, said enclosure parts being shaped so as to define an enclosed void for said workpiece when said enclosure parts are forced into abutment by said first means;

second means for supplying pressurized gas above atmospheric pressure to said void, thereby to process said workpiece by subjecting said workpiece to elevated pressure above atmospheric pressure; and means defining an opening for said workpiece; wherein said pressure vessel has a flexible wall for each enclosure part, each wall extending from its respective part to the opening to define an enclosed passageway between the opening and the void defining parts.

2. A processing system as claimed in claim 1, wherein the flexible walls are in the form of bellows.

3. A processing system for a workpiece comprising:

a pressure vessel, said pressure vessel having a plurality of enclosure parts:

means for fixing said enclosure parts into abutment, said enclosure parts being shaped so as to define an enclosed void for said workpiece when the said enclosure parts are forced into said abutment by said means;

a vacuum chamber defining an opening through which workpieces can be passed; and wherein said pressure vessel has a flexible wall for each enclosure part, each wall extending from its respective enclosure part to the opening to define an enclosed passageway between the opening and the enclosure parts so that when the enclosure parts are in their open position the space between the enclosure parts is continuous with the vacuum chamber.

4. A processing system as claimed in claim 3, wherein the flexible walls are in the form of bellows.

\* \* \* \* \*